United States Patent [19]

Koga

[11] Patent Number: 5,792,691
[45] Date of Patent: Aug. 11, 1998

[54] METHOD OF MANUFACTURING SEMICONDUCTOR MEMORY DEVICE HAVING A CAPACITOR

[75] Inventor: Hiroki Koga, Tokyo, Japan

[73] Assignee: NEC Corporation, Tokyo, Japan

[21] Appl. No.: 881,493

[22] Filed: Jun. 24, 1997

[30] Foreign Application Priority Data

Jun. 27, 1996 [JP] Japan .................................. 8-167381

[51] Int. Cl.$^6$ .................................. H01L 21/8242
[52] U.S. Cl. .................................. 438/233; 438/396
[58] Field of Search .................................. 438/238, 239, 438/253, 281, 396; 257/306

[56] References Cited

U.S. PATENT DOCUMENTS

| 5,387,533 | 2/1995 | Kim | 438/253 |
| 5,409,855 | 4/1995 | Jun | 438/253 |
| 5,629,539 | 5/1997 | Aoki et al. | 257/306 |

OTHER PUBLICATIONS

A Capacitor–Over–Bit–Line (COB) Cell with a Hemispherical-grain Storage Node for 64Mb DRAMS. M. Sakao et al., International Electronic Devices Meeting, San Francisco, CA. Dec. 9–12, 1990, pp. 27.3.1–27.3.4.

*Primary Examiner*—Joni Chang
*Attorney, Agent, or Firm*—Sughrue, Mion, Zinn, Macpeak & Seas, PLLC

[57] ABSTRACT

A method of manufacturing a semiconductor memory device, having the steps of: forming field oxide films in isolation regions on a surface of a p-type silicon substrate, forming a first interlevel insulating film consisting of a silicon oxide film; forming, on a surface of said first interlevel insulating film, bit lines; forming a second interlevel insulating film consisting of a silicon oxide film; forming bit contact holes through the second and first interlevel insulating films, and node contact holes through the second and first interlevel insulating films; forming a photoresist film pattern on a surface of said n$^+$-type poly-Si film; forming poly-Si film; contact plugs, and plug loss portions in which no contact plug is filled; forming an insulating film spacers covering side surfaces of said storage node electrodes, and insulating film caps filled in the plug loss portions; and forming a capacitor insulating film and a cell plate electrode.

9 Claims, 17 Drawing Sheets

5,792,691

METHOD OF MANUFACTURING SEMICONDUCTOR MEMORY DEVICE HAVING A CAPACITOR

BACKGROUND OF THE INVENTION

1. Field of the Invention

The present invention relates to a method of manufacturing a semiconductor memory device and, more particularly, to a manufacturing method associated with the bit contact hole of a DRAM having a memory cell with a COB (Capacitor-Over-Bit-line) structure in which a capacitor is formed over a bit line.

2. Description of the Prior Art

In the memory cell of up to a 4-Mbit DRAM having a stacked capacitor, a capacitor constituting the memory cell is formed below a bit line for reading and writing a memory cell signal. In this structure, the capacitor structure is difficult to devise three-dimensionally due to the presence of a bit contact hole for connecting the bit line and one of the source/drain regions of a transistor. For this reason, a memory cell with the COB structure is employed in a 16-Mbit DRAM.

A DRAM having a memory cell with the conventional COB structure will be described along its manufacturing method with reference to FIG. 1A which is a schematic plan view of the DRAM memory cell, FIGS. 1B, 1C, and 1D which are schematic sectional views taken along the lines IB—IB, IC—IC, and ID—ID in FIG. 1A, respectively, and FIGS. 2A, 2B, 3A, 3B, 4A, and 4B which are schematic sectional views of manufacturing steps taken along the lines IB—IB, IC—IC, and ID—ID in FIG. 1A, respectively. In FIG. 1A, the $n^+$-type source and drain regions and the channel region are hatched with leftwardly declining solid and dotted lines to facilitate the understanding.

Field oxide films 202 about 500 nm thick are formed in element isolation regions on the surface of a p-type silicon substrate 201 by selective oxidation. Gate oxide films 203 about 15 nm thick are formed in element formation regions on the surface of the p-type silicon substrate 201, e.g., in a dry oxygen atmosphere at 900° C. These element formation regions have a T shape, and are regularly arranged on the surface of the p-type silicon substrate 201. To control the threshold of the MOS transistor, boron is ion-implanted at, e.g., 30 keV and $2\times10^{12}$ $cm^{-2}$. An $n^+$-type poly-Si film about 200 nm thick is formed on the entire surface, and patterned to form word lines 204 also serving as gate electrodes. Arsenic is ion-implanted at, e.g., 50 keV and $5\times10^{15}$ $cm^{-2}$ to form $n^+$-type source/drain regions 205 and 206 in self-alignment with the field oxide films 202 and the word lines 204 (see FIGS. 1A to 1D).

A first interlevel insulating film 211 consisting of, e.g., a PSG film about 400 nm thick is formed on the entire surface by CVD. Bit contact holes 213 are formed in the first interlevel insulating film 211 by photolithography with high alignment precision and anisotropic etching to reach the $n^+$-type source/drain regions 205. A tungsten silicide film about 100 nm thick is sputtered on the entire surface, and patterned to form bit lines 216 which are directly connected to the $n^+$-type source/drain regions 205 through the bit contact holes 213 (see FIGS. 1A to 1D, 2A, 3A, and 4A).

A second interlevel insulating film 221 consisting of, e.g., a PSG film about 400 nm thick is formed on the entire surface by CVD. Node contact holes 224 are formed through the interlevel insulating films 211 and 221 by photolithography with high alignment precision and anisotropic etching to reach the $n^+$-type source/drain regions 206 (see FIGS. 1A to 1D, 2B, 3B, and 4B).

A poly-Si film about 300 nm thick is formed on the entire surface, and patterned by photolithography and anisotropic etching to leave poly-Si film patterns in only prospective storage node electrode formation regions. These poly-Si film patterns are directly (not electrically but mechanically) connected to the $n^+$-type source/drain regions 206 through the node contact holes 224. A high-concentration n-type impurity such as phosphorus is doped in these poly-Si film patterns to form storage node electrodes 226 consisting of $n^+$-type poly-Si patterns. A capacitor insulating film 233 consisting of a silicon nitride film about 7 nm thick (formed by CVD), and a cell plate electrode 234 consisting of an $n^+$-type poly-Si film about 100 nm thick (formed by CVD or the like) are formed on the resultant structure to form a DRAM having a memory cell with the COB structure (see FIGS. 1A to 1D).

In the above method of manufacturing the DRAM having the memory cell with the COB structure, the bit contact holes and the node contact holes are separately formed using photolithography with high alignment precision and the like. In the manufacturing process including photolithography with high alignment precision, the yield easily drops due to the use of this particular manufacturing process (compared to another manufacturing process). In this manufacturing process, the manufacturing throughput is inevitably low. That is, the manufacturing cost increases in proportion to the number of manufacturing steps for forming contact holes.

SUMMARY OF THE INVENTION

It is an object of the present invention to provide a method of manufacturing a semiconductor memory device in which the number of manufacturing steps for forming contact holes is decreased to suppress a decrease in yield and an increase in manufacturing cost when a DRAM having a memory cell with the COB structure is formed.

To achieve the above object, according to the first aspect of the present invention, there is provided a method of manufacturing a semiconductor memory device, comprising the steps of forming field oxide films in element isolation regions on a surface of a p-type silicon substrate, forming gate oxide films in the element formation regions on the surface of the p-type silicon substrate, forming word lines also serving as gate electrodes, and forming $n^+$-type source/drain regions in the element formation regions in self-alignment with the word lines, forming a first interlevel insulating film consisting of a silicon oxide film, forming, on a surface of the first interlevel insulating film, bit lines each having a portion overlapping part of one of the $n^+$-type source/drain regions through the first interlevel insulating film, forming a second interlevel insulating film consisting of a silicon oxide film, forming bit contact holes through the second and first interlevel insulating films to reach one of the $n^+$-type source/drain regions, while exposing parts of upper and side surfaces of the bit lines at the overlapping portions, and node contact holes through the second and first interlevel insulating films to reach the other of the $n^+$-type source/drain regions, forming an $n^+$-type poly-Si film on an entire surface, and a photoresist film pattern on a surface of the $n^+$-type poly-Si film so as to selectively cover prospective storage node electrode formation regions, performing anisotropic etching for the $n^+$-type poly-Si film by using the photoresist film pattern as a mask to form storage node electrodes directly connected to the other of the $n^+$-type source/drain regions through the node contact holes, and forming, in the bit contact holes, contact plugs each of which has an upper surface located at a desired level between an upper end of the bit contact hole and an upper surface of the bit line, and is directly connected to one of the n$^+$-type source/drain regions, and plug loss portions in which no contact plug is filled, forming an insulating film on an entire surface by LPCVD, and etching back the insulating film to form insulating film spacers covering side surfaces of the storage node electrodes, and insulating film caps filled in the plug loss portions, and forming a capacitor insulating film and a cell plate electrode.

According to the second aspect of the present invention, there is provided a method of manufacturing a semiconductor memory device, comprising the steps of forming field oxide films in element isolation regions on a surface of a p-type silicon substrate, forming gate oxide films in the element formation regions on the surface of the p-type silicon substrate, forming word lines also serving as gate electrodes, and forming n$^+$-type source/drain regions in the element formation regions in self-alignment with the word lines, forming a first interlevel insulating film consisting of a first silicon-oxide-based insulating film, forming, on a surface of the first interlevel insulating film, bit lines each having a portion overlapping part of one of the n$^+$-type source/drain regions through the first interlevel insulating film, forming a second interlevel insulating film constituted by stacking a silicon nitride film on a second silicon-oxide-based insulating film consisting of the same material as that of the first silicon-oxide-based insulating film, forming bit contact holes through the second and first interlevel insulating films to reach one of the n$^+$-type source/drain regions, while exposing parts of upper and side surfaces of the bit lines at the overlapping portions, and node contact holes through the second and first interlevel insulating films to reach the other of the n$^+$-type source/drain regions, forming an n$^+$-type poly-Si film on an entire surface, and a photoresist film pattern on a surface of the n$^+$-type poly-Si film so as to selectively cover prospective storage node electrode formation regions, performing anisotropic etching for the n$^+$-type poly-Si film by using the photoresist film pattern as a mask to form storage node electrodes directly connected to the other of the n$^+$-type source/drain regions through the node contact holes, and forming, in the bit contact holes, contact plugs each of which has an upper surface located at a desired level between an upper end of the bit contact hole and an upper surface of the bit line, and is directly connected to one of the n$^+$-type source/drain regions, and plug loss portions in which no contact plug is filled, forming an insulating film on an entire surface by LPCVD, and etching back the insulating film to form insulating film spacers covering side surfaces of the storage node electrodes, and insulating film caps filled in the plug loss portions, selectively removing the insulating film spacers, and forming a capacitor insulating film and a cell plate electrode.

In the second aspect, the method preferably further comprises the steps of forming a photoresist film to cover an entire surface after forming the insulating film spacers and the insulating film caps, and selectively etching back the photoresist film until part of each of the insulating film spacers is exposed, and selectively removing the insulating film spacers by using the remaining photoresist film as a mask, and removing the photoresist film. Alternatively, the method preferably further comprises the step of forming a photoresist film to cover an entire surface after forming the insulating film spacers and the insulating film caps, and simultaneously etching back the photoresist film and the insulating film spacers.

According to the third aspect of the present invention, there is provided a method of manufacturing a semiconductor memory device, comprising the steps of forming field oxide films in element isolation regions on a surface of a p-type silicon substrate, forming gate oxide films in the element formation regions on the surface of the p-type silicon substrate, forming word lines also serving as gate electrodes, and forming n$^+$-type source/drain regions in the element formation regions in self-alignment with the word lines, forming a first interlevel insulating film consisting of a first silicon-oxide-based insulating film, forming, on a surface of the first interlevel insulating film, bit lines each having a portion overlapping part of one of the n$^+$-type source/drain regions through the first interlevel insulating film, forming a second interlevel insulating film constituted by stacking a silicon nitride film on a second silicon-oxide-based insulating film consisting of the same material as that of the first silicon-oxide-based insulating film, forming bit contact holes through the second and first interlevel insulating films to reach one of the n$^+$-type source/drain regions, while exposing parts of upper and side surfaces of the bit lines at the overlapping portions, and node contact holes through the second and first interlevel insulating films to reach the other of the n$^+$-type source/drain regions, forming an n$^+$-type poly-Si film on an entire surface, and a photoresist film pattern on a surface of the n$^+$-type poly-Si film so as to selectively cover prospective storage node electrode formation regions, performing anisotropic etching for the n$^+$-type poly-Si film by using the photoresist film pattern as a mask to form storage node electrodes directly connected to the other of the n$^+$-type source/drain regions through the node contact holes, and forming, in the bit contact holes, contact plugs each of which has an upper surface located at a desired level between an upper end of the bit contact hole and an upper surface of the bit line, and is directly connected to one of the n$^+$-type source/drain regions, and plug loss portions in which no contact plug is filled, forming a silicon oxide film on an entire surface to leave insulating film caps consisting of the silicon oxide film at the plug loss portions, and forming a capacitor insulating film and a cell plate electrode.

In the third aspect, it is preferable that the silicon oxide film be formed by LPCVD, and the insulating film caps be left by forming a photoresist film to cover the silicon oxide film and etching back the photoresist film and the silicon oxide film, that the silicon oxide film be formed by liquid-phase epitaxy, and the insulating film caps be left by etching back the silicon oxide film, or that the silicon oxide film be formed by bias ECR plasma CVD, and the insulating film caps be left by etching back the silicon oxide film.

According to the fourth aspect of the present invention, there is provided a method of manufacturing a semiconductor memory device, comprising the steps of forming field oxide films in element isolation regions on a surface of a p-type silicon substrate, forming gate oxide films in the element formation regions on the surface of the p-type silicon substrate, forming word lines also serving as gate electrodes, and forming n$^+$-type source/drain regions in the element formation regions in self-alignment with the word lines, forming a first interlevel insulating film consisting of a first silicon-oxide-based insulating film, forming, on a surface of the first interlevel insulating film, bit lines each having a portion overlapping part of one of the n$^+$-type source/drain regions through the first interlevel insulating film, forming a second interlevel insulating film constituted by stacking a silicon nitride film on a second silicon-oxide-based insulating film consisting of the same material as that of the first silicon-oxide-based insulating film, forming bit contact holes through the second and first interlevel insulating films to reach one of the $n^+$-type source/drain regions, while exposing parts of upper and side surfaces of the bit lines at the overlapping portions, and node contact holes through the second and first interlevel insulating films to reach the other of the $n^+$-type source/drain regions, forming a conductive film on an entire surface, etching back the conductive film to fill the node contact holes to upper ends, thereby forming first contact plugs directly connected to the other of the $n^+$-type source/drain regions, and to fill the bit contact holes to upper ends, thereby forming second contact plugs directly connected to one of the $n^+$-type source/drain regions, selectively etching the second contact plugs by using, as a mask, a photoresist film pattern which covers surfaces of the first contact plugs and has opening portions on surfaces of the second contact plugs, thereby forming third contact plugs each having an upper surface located at a desired level between an upper end of the bit contact hole and an upper surface of the bit line, and plug loss portions in which no third contact plug is filled, forming a silicon oxide film on an entire surface to leave insulating film caps consisting of the silicon oxide film at the plug loss portions, forming an $n^+$-type poly-Si film on an entire surface, and patterning the $n^+$-type poly-Si film to form storage node electrodes directly connected to the first contact plugs, and forming a capacitor insulating film and a cell plate electrode.

According to the present invention having the respective aspects, after a first interlevel insulating film, bit lines, and a second interlevel insulating film are formed in forming a DRAM having a memory cell with the COB structure, bit contact holes and node contact holes are simultaneously formed by photolithography with high alignment precision. Contact plugs and plug loss portions are formed in the bit contact holes, and these plug loss portions are filled with insulating film caps. Compared to the conventional manufacturing method, the number of photolithography steps for forming the contact holes can be decreased. As a result, a decrease in yield and an increase in manufacturing cost can be easily suppressed, compared to the conventional method of manufacturing a semiconductor memory device.

The above and many other object, features and advantages of the present invention will become manifest to those skilled in the art upon making reference to the following detailed description and accompanying drawings in which preferred embodiments incorporating the principles of the present invention are shown by way of illustrative example.

DETAILED DESCRIPTION OF PREFERRED EMBODIMENTS

Several preferred embodiments of the present invention will be described below with reference to the accompanying drawings.

Figure 1A:
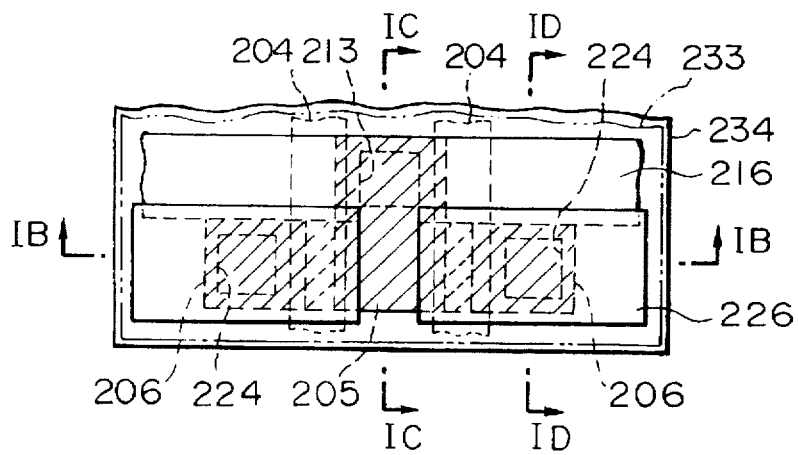
FIG. 1A is a schematic top-cutaway plan view of a DRAM having a memory cell with a COB structure in a prior art.
Figure 1B:
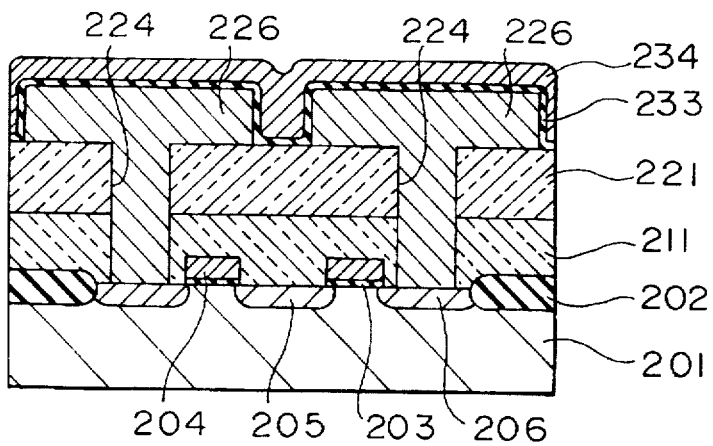
FIGS. 1B to 1D are schematic sectional views taken along the lines IB—IB, IC—IC, and ID—ID in FIG. 1A, respectively.
Figure 1C:
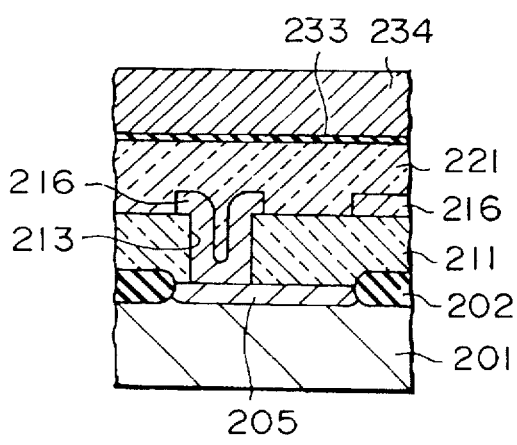
Figure 1D:
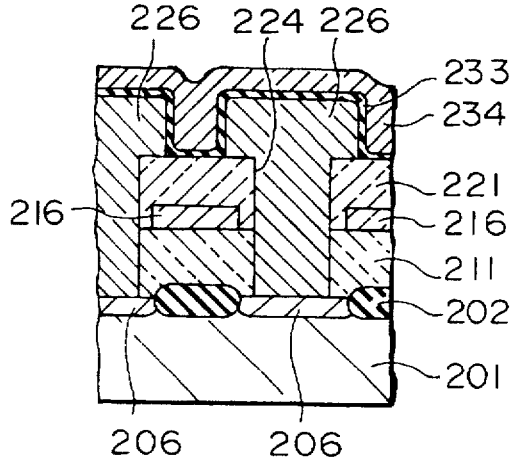
Figure 2A:
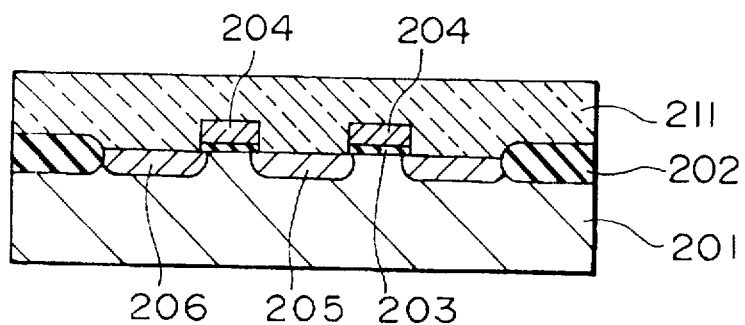
FIGS. 2A and 2B are schematic sectional views, respectively, showing some of manufacturing steps in the prior art shown in FIGS. 1A to 1D which are taken along the line IB—IB in FIG. 1A.
Figure 2B:
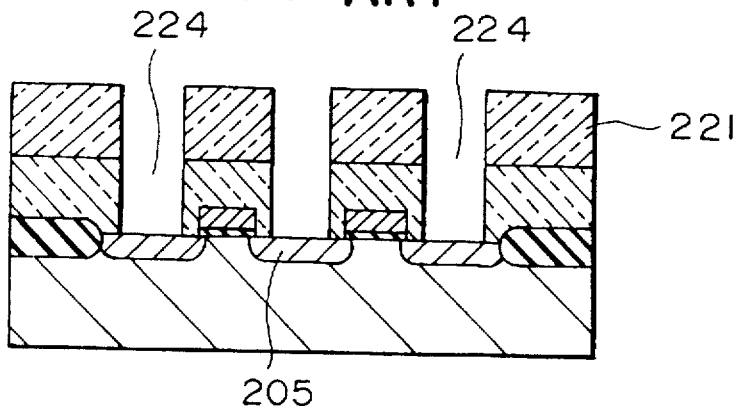
Figure 3A:
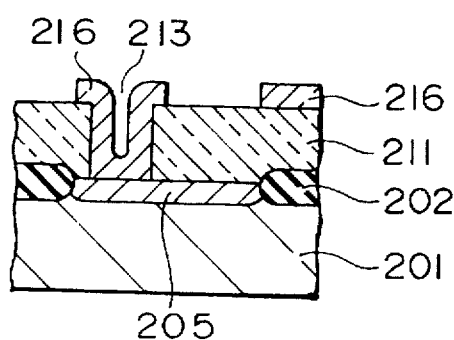
FIGS. 3A and 3B are schematic sectional views, respectively, showing some of manufacturing steps in the prior art shown in FIGS. 1A to 1D which are taken along the line IC—IC in FIG. 1A.
Figure 3B:
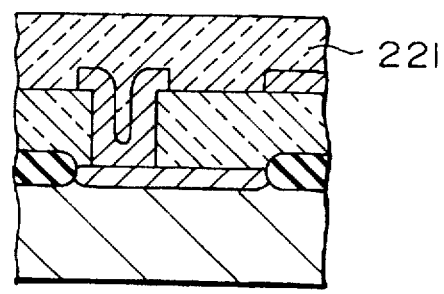
Figure 4A:
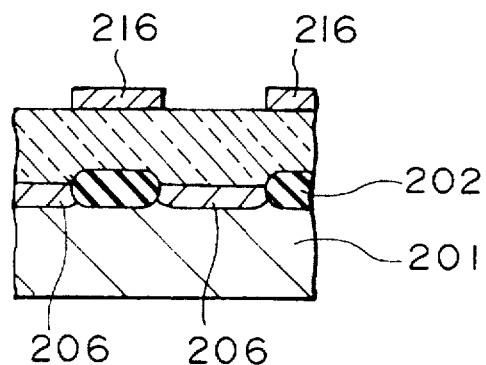
FIGS. 4A and 4B are schematic sectional views, respectively, showing some of manufacturing steps in the prior art shown in FIGS. 1A to 1D which are taken along the line ID—ID in FIG. 1A.
Figure 4B:
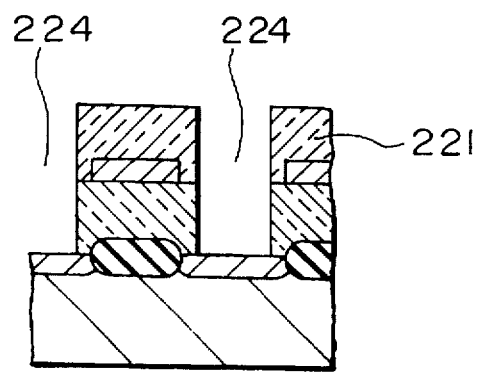
Figure 5A:
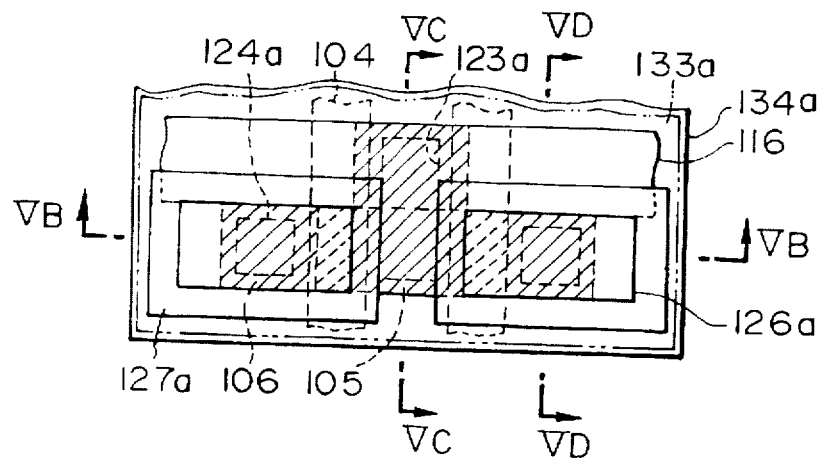
FIG. 5A is a schematic top-cutaway plan view of the first embodiment of the present invention.
Figure 5B:
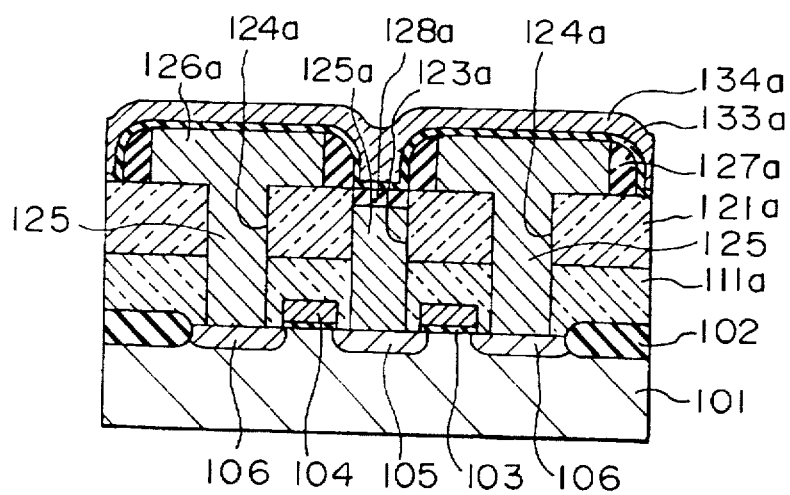
FIGS. 5B to 5D are schematic sectional views taken along the lines VB—VB, VC—VC, and VD—VD in FIG. 5A, respectively.
Figure 5C:
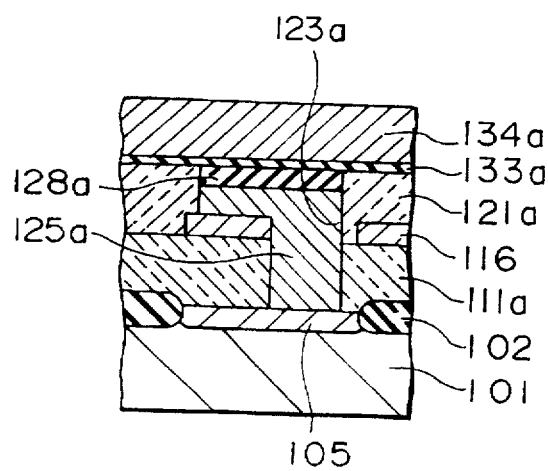
Figure 5D:
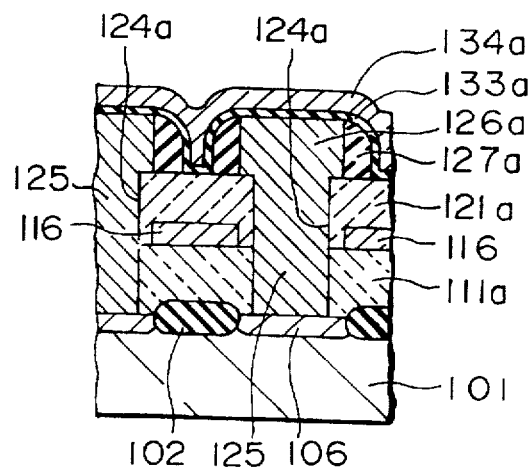

The first embodiment of the present invention will be described along its manufacturing method with reference to FIG. 5A which is a schematic top-cutaway plan view of a DRAM memory cell, FIGS. 5B, 5C, and 5D which are schematic sectional views taken along the lines VB—VB, VC—VC, and VD—VD in FIG. 5A, respectively. FIGS. 6A to 6F which are schematic sectional views, respectively, showing some of manufacturing steps taken along the line VB—VB in FIG. 5A, FIGS. 7A to 7F which are schematic sectional views, respectively, showing some of manufacturing steps taken along the line VC—VC in FIG. 5A, and FIGS. 8A to 8F which are schematic sectional views, respectively, showing some of manufacturing steps taken along the line VD—VD in FIG. 5A. In FIG. 5A, the $n^+$-type source and drain regions and the channel region are hatched with leftwardly declining solid and dotted lines to facilitate the understanding.

Field oxide films 102 about 500 nm thick are formed in element isolation regions on the surface of a p-type silicon substrate 101 by selective oxidation. Gate oxide films 103 about 15 nm thick are formed in element formation regions on the surface of the p-type silicon substrate 101, e.g., in a dry oxygen atmosphere at 900° C. These element formation regions (having, e.g., a T shape) are regularly arranged on the surface of the p-type silicon substrate 101. To control the threshold of the MOS transistor, boron is ion-implanted at, e.g., 30 keV and $2\times10^{12}$ $cm^{-2}$. An $n^+$-type poly-Si film about 200 nm thick is formed on the entire surface, and patterned to form word lines 104 also serving as gate electrodes. Phosphorus is ion-implanted at, e.g., 30 keV and $1\times10^{15}$ $cm^{-2}$ to form $n^+$-type source/drain regions 105 and 106 in self-alignment with the field oxide films 102 and the word lines 104. A first interlevel insulating film 111a consisting of, e.g., a silicon oxide film about 400 nm thick is formed on the entire surface by atmospheric pressure chemical vapor deposition (APCVD), LPCVD, or the like. The upper surface of the interlevel insulating film 111a is preferably planarized by chemical mechanical polishing (CMP). A tungsten silicide film about 100 nm thick is sputtered on the entire surface, and patterned to form bit lines 116 each having a portion overlapping part of the $n^+$-type source/drain region 105 through the interlevel insulating film 111a. A second interlevel insulating film 121a which has a thickness of about 400 nm and consists of a silicon oxide film with a flat upper surface is formed on the entire surface by APCVD, LPCVD, CMP, or the like (see FIGS. 5A to 5D, 6A, 7A, and 8A).

Bit contact holes 123a and node contact holes 124a are formed by photolithography with high alignment precision and anisotropic etching to reach the $n^+$-type source/drain regions 105 and 106 through the interlevel insulating films 121a and 111a. The interval between the bit contact hole 123a and the word line 104, and the intervals between the node contact hole 124a, and the word line 104 and the bit line 116 are set to predetermined values. The opening portion at the upper end of the bit contact hole 123a is rectangular, and the smaller opening diameter is equal to the minimum feature size (=F). The opening portion of the node contact hole 124a is almost square, and its opening diameter is F. Parts of the upper and side surfaces of the bit line 116 are exposed at its overlapping portion through the bit contact hole 123a (see FIGS. 5A to 5D, 6B, 7B, and 8B). This anisotropic etching is performed using a parallel plate RIE apparatus at RF power of 0.8 kW/cm$^2$, a gas pressure of 66 Pa, a trifluoromethane (CHF$_3$) gas flow rate of 30 sccm, a tetrafluoromethane (CF$_4$) gas flow rate of 10 sccm, an argon (Ar) gas flow rate of 200 sccm, and a frequency of 400 kHz. Formation of the bit contact hole 123a with this shape utilizes that the etching rate (about 40 nm/min) for the bit line 116 (consisting of the tungsten silicide film) is about 1/20 the etching rate (about 800 nm/min) for the interlevel insulating films 121a and 111a.

An $n^+$-type poly-Si film 145a about 300 nm thick is formed on the entire surface by LPCVD or the like. Although the $n^+$-type poly-Si film 145a may be formed by doping a high-concentration n-type impurity after forming an undoped poly-Si film, it is preferably an $n^+$-type (polycrystalline or amorphous) silicon film in the film formation stage. LPCVD is used to form the $n^+$-type poly-Si film 145a because the bit contact hole 123a and the node contact hole 124a can be satisfactorily filled. The $n^+$-type poly-Si film 145a is preferably an $n^+$-type silicon film in the film formation stage so as to reduce the difference in impurity concentration of the $n^+$-type poly-Si film 145a between the upper surface of the interlevel insulating film 121a and the bottom portions of the bit and node contact holes 123a and 124a. A photoresist film pattern 155a is formed on the surface of the $n^+$-type poly-Si film 145a to cover the prospective storage node electrode formation regions (see FIGS. 6C, 7C, and 8C). The prospective storage node electrode formation regions are set in consideration of the thickness of an insulating film spacer to be formed on the side surface of each storage node electrode, the interval between the storage node electrode and the bit contact hole 123a, and the interval between the insulating film spacers of the adjacent storage node electrodes.

The $n^+$-type poly-Si film 145a is anisotropically etched using the photoresist film pattern 155a as a mask. This anisotropic etching is performed using a parallel plate RIE apparatus at RF power of 0.3 kW/cm$^2$, a gas pressure of 60 Pa, a chlorine (Cl$_2$) gas flow rate of 200 sccm, a hydrogen bromide (HBr) gas flow rate of 100 sccm, and a frequency of 13.56 MHz. This anisotropic etching is monitored using the plasma emission intensity of silicon halide gas produced upon reaction. Using this monitoring, the $n^+$-type poly-Si film 145a is over-etched from the upper end of the bit contact hole 123a to a depth of about 50 nm to remove the $n^+$-type poly-Si film 145a. With this processing, storage node electrodes 126a directly connected to the $n^+$-type source/drain regions 106 through the node contact holes 124a are formed, while contact plugs 125a electrically connecting the $n^+$-type source/drain regions 105 and the bit lines 116, and plug loss portions 146a, are formed in the bit contact holes 123a (see FIGS. 5A to 5D, 6D, 7D, and 8D).

Figure 6A:
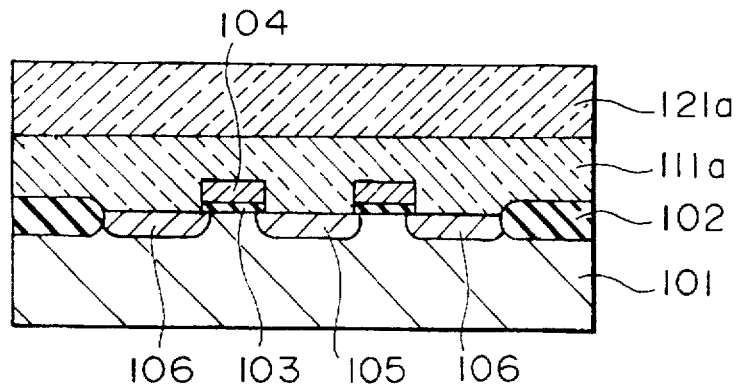
FIGS. 6A to 6F are schematic sectional views, respectively, showing some of manufacturing steps in the first embodiment shown in FIGS. 5A to 5D which are taken along the line VB—VB in FIG. 5A.
Figure 6B:
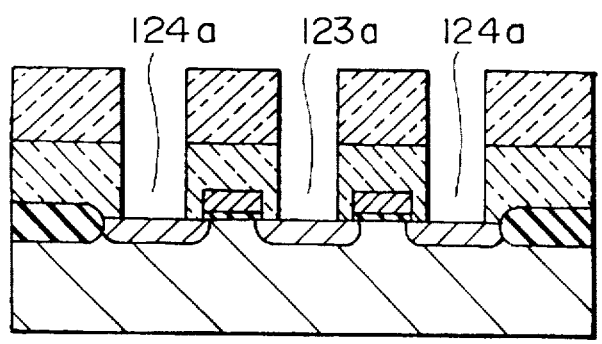
Figure 6C:
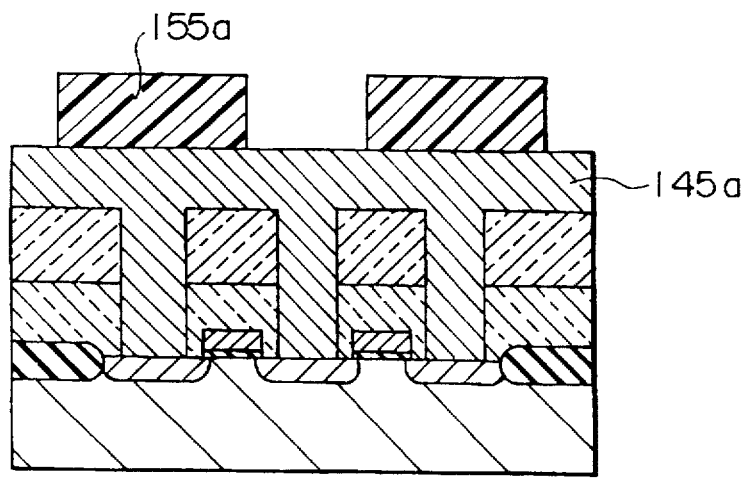
Figure 6D:
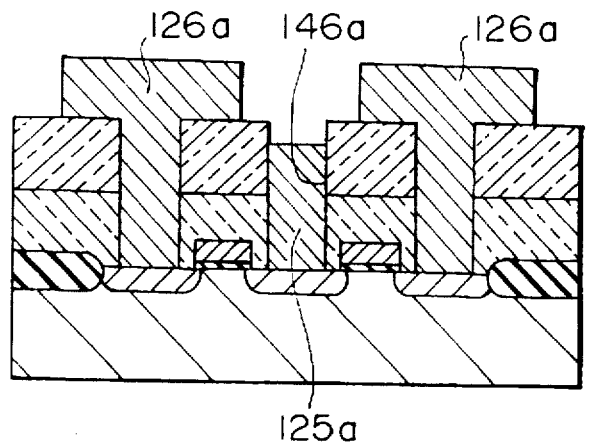
Figure 6E:
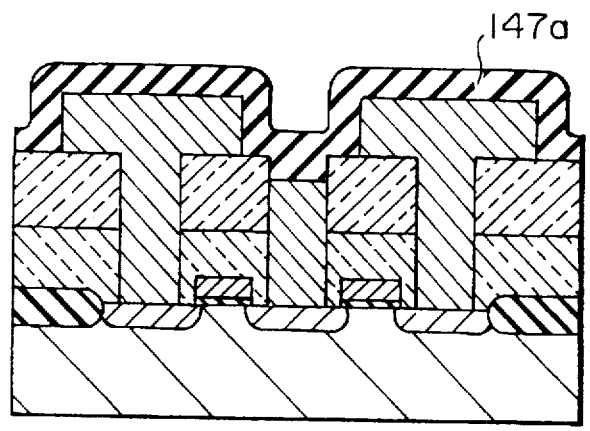
Figure 6F:
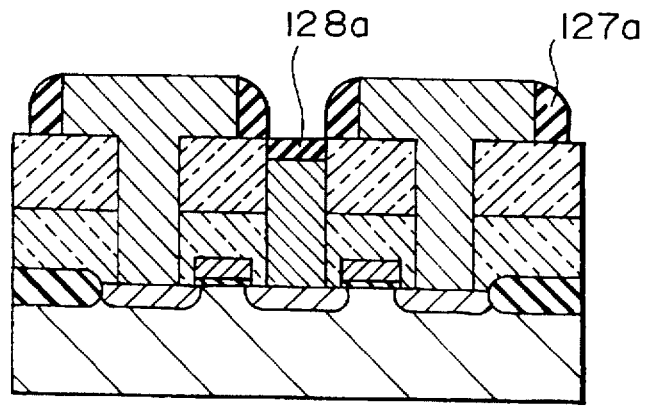
Figure 7A:
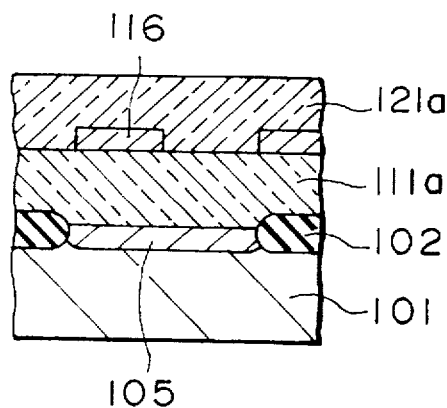
FIGS. 7A to 7F are schematic sectional views, respectively, showing some of manufacturing steps in the first embodiment shown in FIGS. 5A to 5D which are taken along the line VC—VC in FIG. 5A.
Figure 7D:
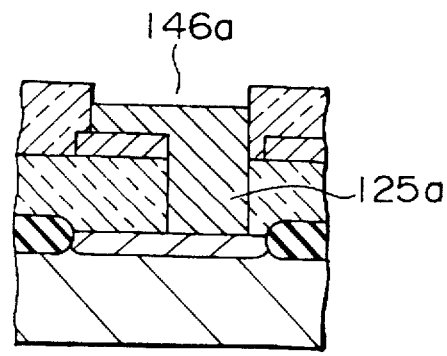
Figure 7B:
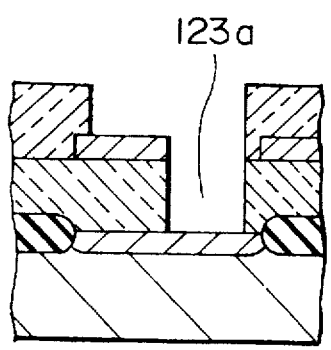
Figure 7E:
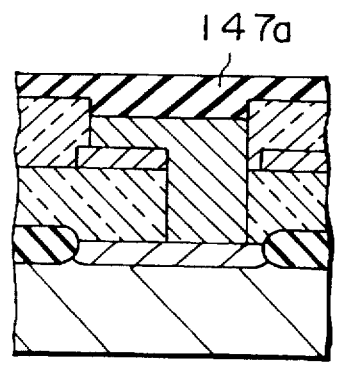
Figure 7C:
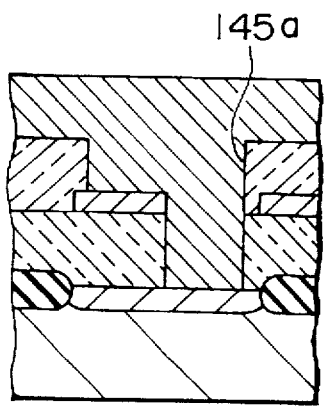
Figure 7F:
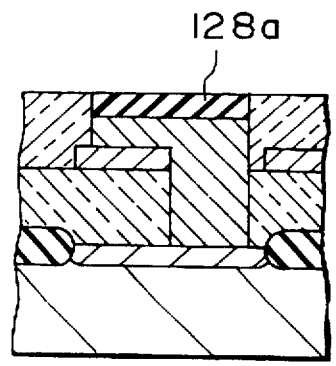
Figure 8A:
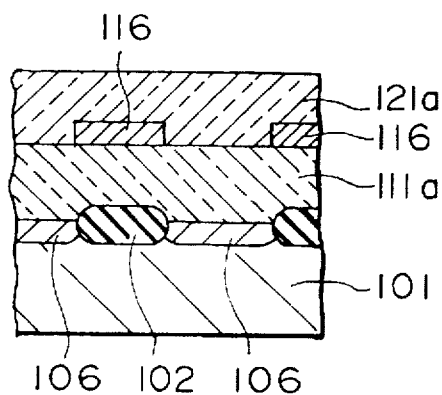
FIGS. 8A to 8F are schematic sectional views, respectively, showing some of manufacturing steps in the first embodiment shown in FIGS. 5A to 5D which are taken along the line VD—VD in FIG. 5A.
Figure 8D:
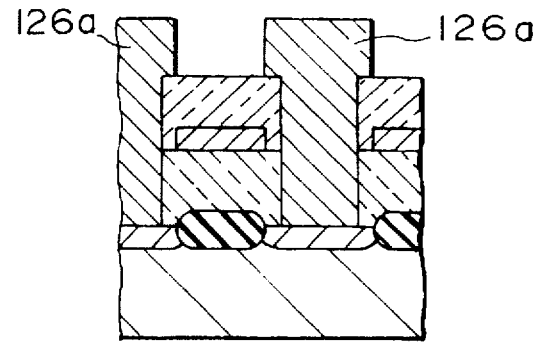
Figure 8B:
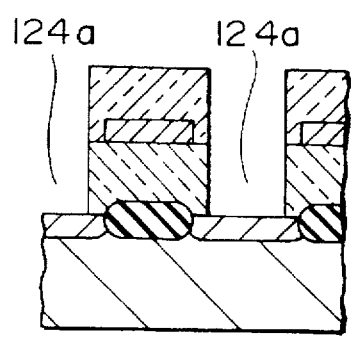
Figure 8E:
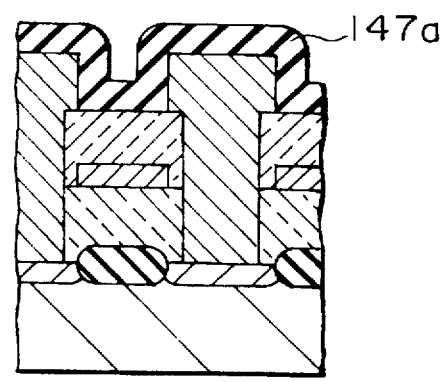
Figure 8C:
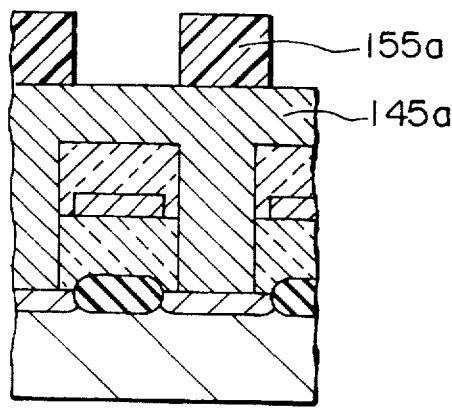
Figure 8F:
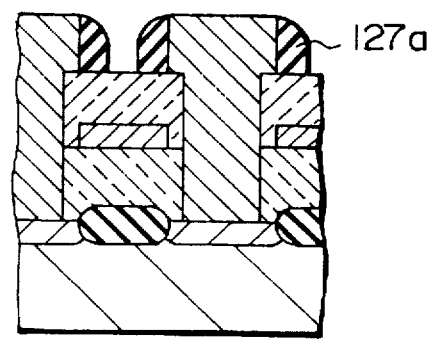

A silicon oxide film 147a (or silicon nitride film) having a predetermined thickness is formed on the entire surface by LPCVD (see FIGS. 6E, 7E, and 8E).

The silicon oxide film 147a is anisotropically etched back to leave insulating film spacers 127a covering the side surfaces of the storage node electrodes 126a and insulating film caps 128a filled in the plug loss portions 146a (see FIGS. 5A to 5D, 6F, 7F, and 8F).

A capacitor insulating film 133a consisting of a silicon nitride film about 7 nm thick, and a cell plate electrode 134a consisting of an $n^+$-type poly-Si film about 100 nm thick are formed on the resultant structure to form a DRAM having a memory cell with the COB structure according to the first embodiment (see FIGS. 5A to 5D).

As described above, in the first embodiment, the bit contact hole 123a and the node contact hole 124a are formed in one photolithography step after forming the interlevel insulating film 121a. The number of manufacturing steps (including photolithography with high alignment precision) for forming contact holes can be decreased, compared to the conventional manufacturing method. As a result, a decrease in yield and an increase in manufacturing cost can be easily suppressed.

Figure 9A:
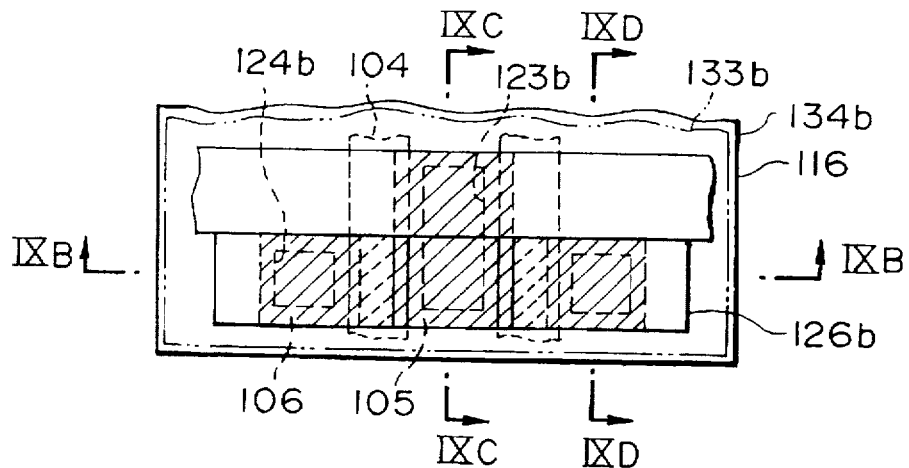
FIG. 9A is a schematic top-cutaway plan view of the second embodiment of the present invention.
Figure 9B:
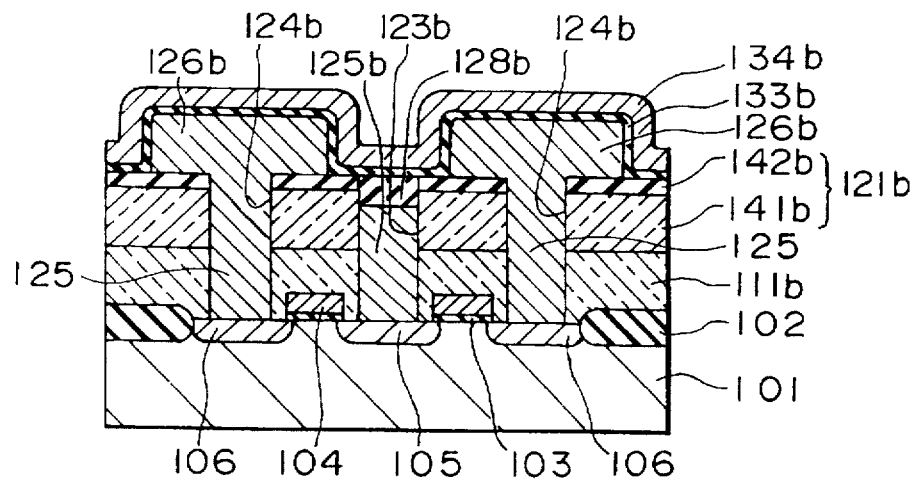
FIGS. 9B to 9D are schematic sectional views taken along the lines IXB—IXB, IXC—IXC, and IXD—IXD in FIG. 9A, respectively.
Figure 9C:
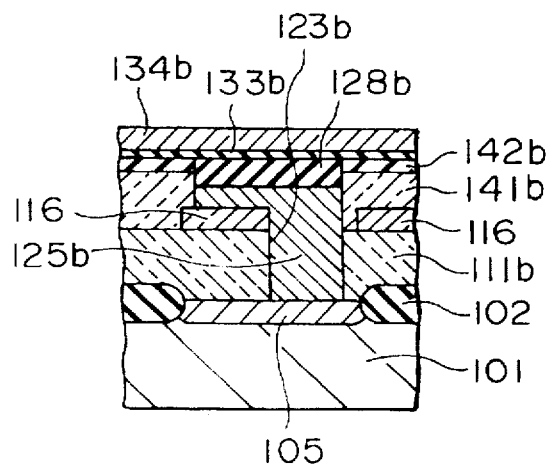
Figure 9D:
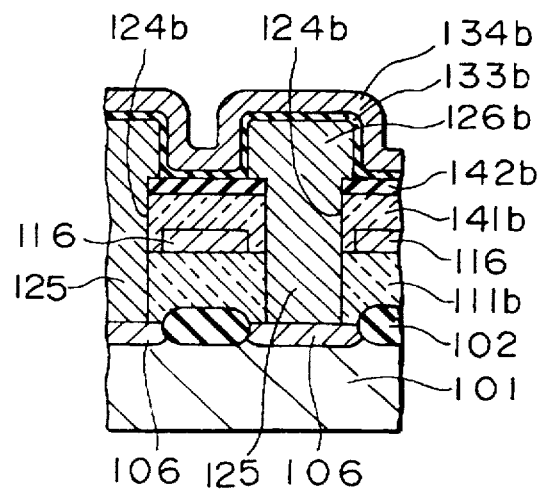
Figure 10A:
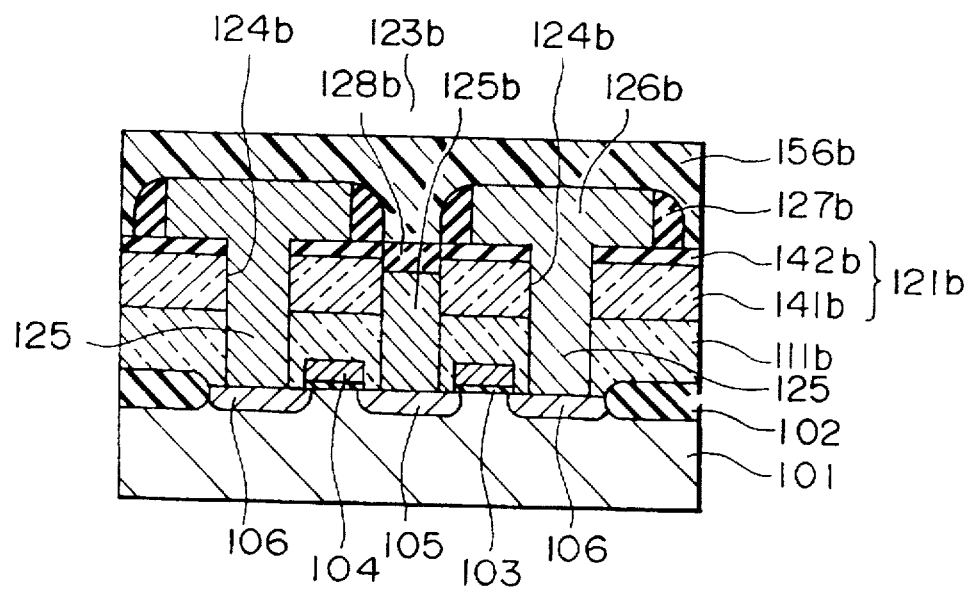
FIGS. 10A and 10B are schematic sectional views, respectively, showing some of manufacturing steps in the second embodiment shown in FIGS. 9A to 9D which are taken along the line IXB—IXB in FIG. 9A.
Figure 10B:
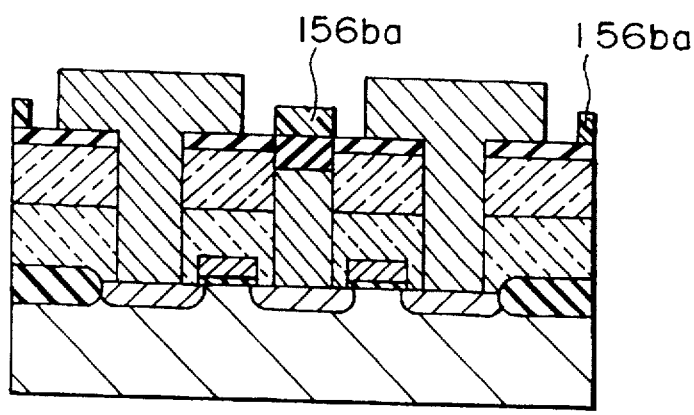
Figure 11A:
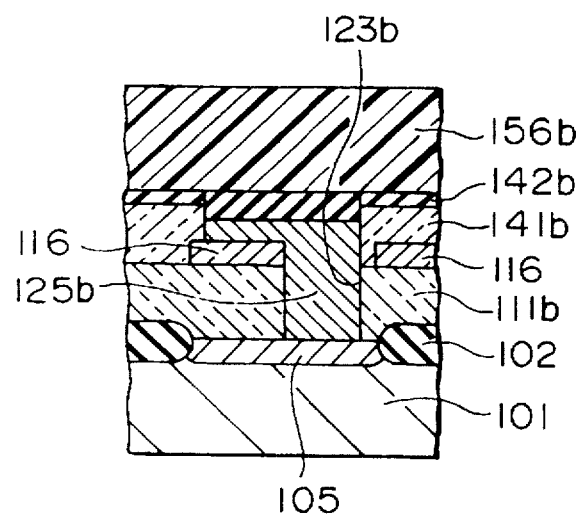
FIGS. 11A and 11B are schematic sectional views, respectively, showing some of manufacturing steps in the second embodiment shown in FIGS. 9A to 9D which are taken along the line IXC—IXC in FIG. 9A.
Figure 11B:
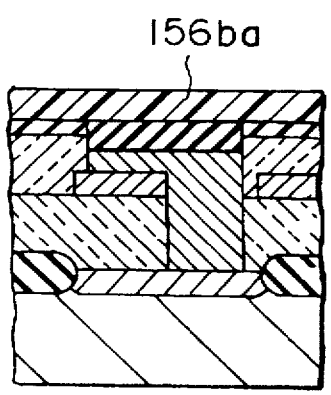
Figure 12A:
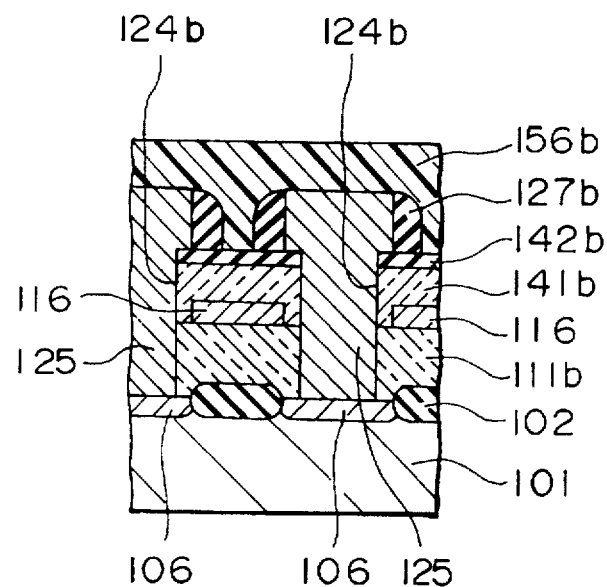
FIGS. 12A and 12B are schematic sectional views, respectively, showing some of manufacturing steps in the second embodiment shown in FIGS. 9A to 9D which are taken along the line IXD—IXD in FIG. 9A.
Figure 12B:
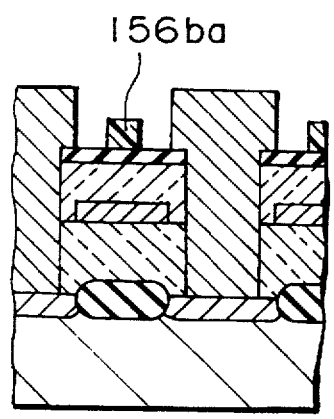

The second embodiment of the present invention will be described with reference to FIG. 9A which is a schematic top-cutaway plan view of a DRAM memory cell according to the second embodiment of the present invention, FIGS. 9B, 9C, and 9D which are schematic sectional views taken along the lines IXB—IXB, IXC—IXC, and IXD—IXD in FIG. 9A, respectively, FIGS. 10A and 10B which are schematic sectional views, respectively, showing some of manufacturing steps taken along the line IXB—IXB in FIG. 9A, FIGS. 11A and 11B which are schematic sectional views, respectively, showing some of manufacturing steps taken along the line IXC—IXC in FIG. 9A, and FIGS. 12A and 12B which are schematic sectional views, respectively, showing some of manufacturing steps taken along the line IXD—IXD in FIG. 9A. The second embodiment of the present invention is different from the first embodiment in formation (arrangement) of an interlevel insulating film and removal of an insulating film spacer. A manufacturing method according to the second embodiment is as follows.

After the structure up to word lines 104 are formed in the same manner as in the first embodiment, an interlevel insulating film 111b consisting of a silicon oxide film about 400 nm thick is formed. After bit lines 116 are formed, an interlevel insulating film 121b constituted by staking a silicon oxide film 141b having a flat upper surface and a thickness of about 400 nm, and a silicon nitride film 142b about 20 nm thick is formed. Note that the interlevel insulating film 111b may be constituted by a PSG film, instead of the silicon oxide film. In this case, a PSG film preferably replaces the silicon oxide film 141b constituting the interlevel insulating film 121b in consideration of etching in forming contact holes. In the same manner as in the first embodiment, bit contact holes 123b and node contact holes 124b are formed, storage node electrodes 126b and contact plugs 125b are formed, and insulating film spacers 127b and insulating film caps 128b which consist of silicon oxide films are formed (see FIGS. 9A to 9D). In the second embodiment, since the upper surface of the interlevel insulating film 121b consists of the silicon nitride film 142b, the controllability in forming the insulating film spacers 127b and the insulating film caps 128b by etching back the silicon oxide film is superior to that in the first embodiment. Then, a photoresist film 156b is formed to cover the entire surface (see FIGS. 10A, 11A, and 12A).

The photoresist film 156b is etched back with, e.g., an oxygen plasm until at least the upper ends of the insulating film spacers 127b are exposed, leaving photoresist films 156ba. Using the photoresist films 156ba as a mask, the insulating film spacers 127b are selectively removed by wet etching using, e.g., buffered hydrofluoric acid (see FIGS. 9A to 9D, 10B, 11B, and 12B).

After the photoresist films 156ba are removed by an oxygen plasma, a capacitor insulating film 133b consisting of a silicon nitride film about 7 nm thick, and a cell plate electrode 134b consisting of an n⁺-type poly-Si film about 100 nm thick are formed on the resultant structure to form a DRAM having a memory cell with the COB structure according to the second embodiment (see FIGS. 9A to 9D).

The second embodiment has the same effects as those of the first embodiment. Further, the above-described insulating film spacer 127b and insulating film cap 128b have superior processability. Unlike the first embodiment, the side surface of the storage node electrode 126b also functions as a capacitor in the second embodiment.

With reference to FIGS. 13A to 13C and 9A to 9D which are schematic sectional views of main steps of manufacturing the DRAM memory cell, a modification of the second embodiment is different from the second embodiment in a method of removing the insulating film spacer 127b.

Figure 13A:
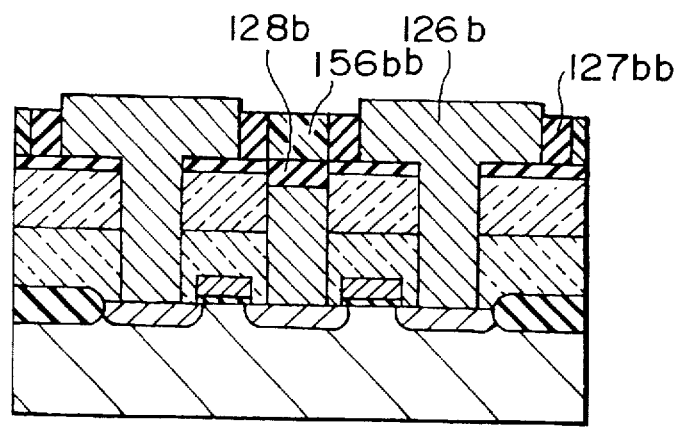
FIGS. 13A to 13C are schematic sectional views, respectively, showing main manufacturing steps in a modification of the second embodiment shown in FIGS. 9A to 9D.
Figure 13B:
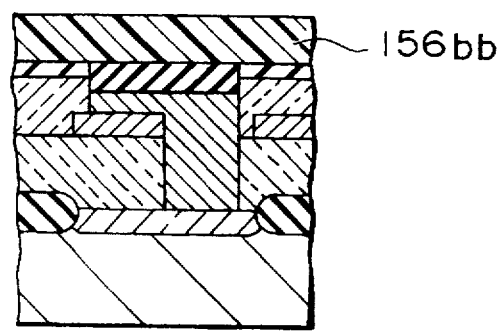
Figure 13C:
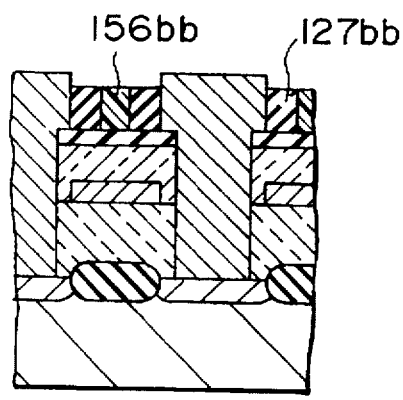

In the same manner as in the second embodiment, the insulating film spacers 127b, the insulating film caps 128b, and the photoresist film 156b are formed. Then, the photoresist film 156b and the insulating film spacers 127b are etched back by anisotropic etching at nearly the same etching rates for the photoresist film 156b and the insulating film spacers 127b. This anisotropic etching is performed using a parallel plate RIE apparatus at power of 600 W, a gas pressure of 670 Pa, a CHF₃ gas flow rate of 60 scam, and an oxygen (O₂) gas flow rate of 40 scam. The etching rate of this anisotropic etching for the n⁺-type poly-Si film is about ¹⁄₂₀ to ¹⁄₃₀ the etching rate for the silicon oxide film and the photoresist film. For this reason, even if the photoresist film 156b and the insulating film spacers 127b are etched back to serve as photoresist films 155bb and insulating film spacers 127bb, as shown in FIGS. 13A to 13C, the storage node electrodes 126b are hardly influenced.

In the anisotropic etching, the plasma emission intensity of carbon monoxide (CO) as a reaction product gas is used for monitoring. Changes in emission intensity are used to detect whether the insulating film spaces and the photoresist film are completely removed and the silicon nitride film 142b serving as the upper surface of the interlevel insulating film 121b is exposed. Subsequently, the DRAM shown in FIGS. 9A to 9D is formed in the same manner as in the second embodiment.

Figure 14A:
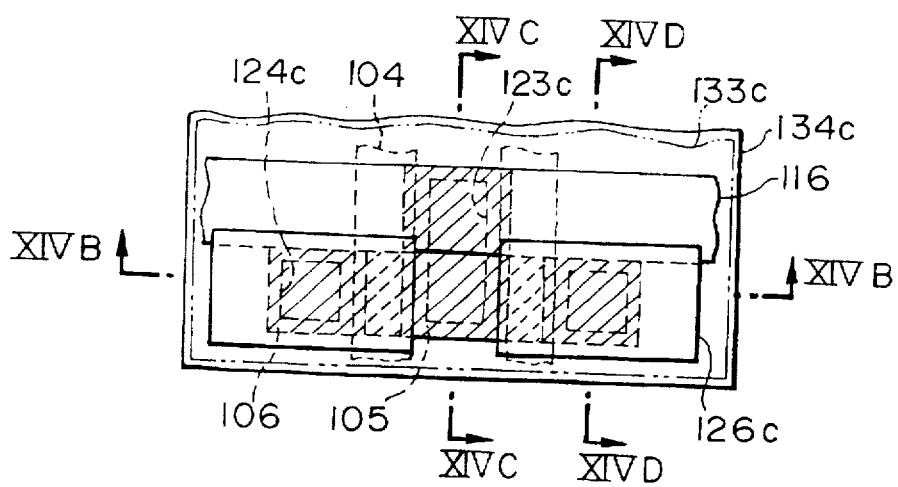
FIG. 14A is a schematic top-cutaway plan view of the third embodiment of the present invention.
Figure 14B:
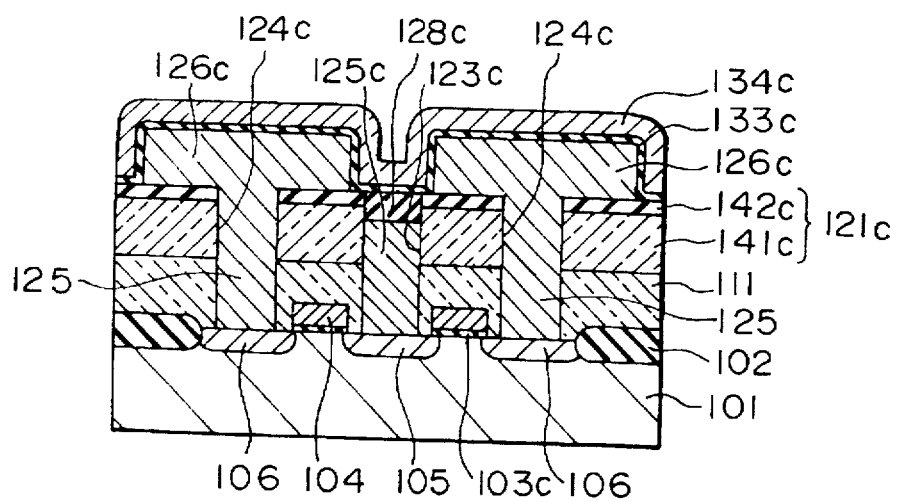
FIGS. 14B to 14D are schematic sectional views taken along the lines XIVB—XIVB, XIVC—XIVC, and XIVD—XIVD in FIG. 14A, respectively.
Figure 14C:
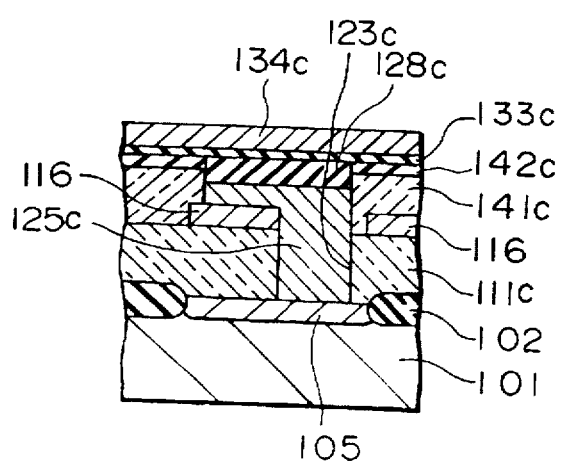
Figure 14D:
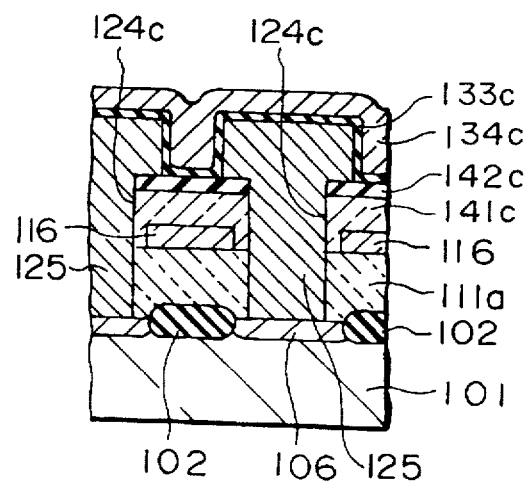
Figure 15A:
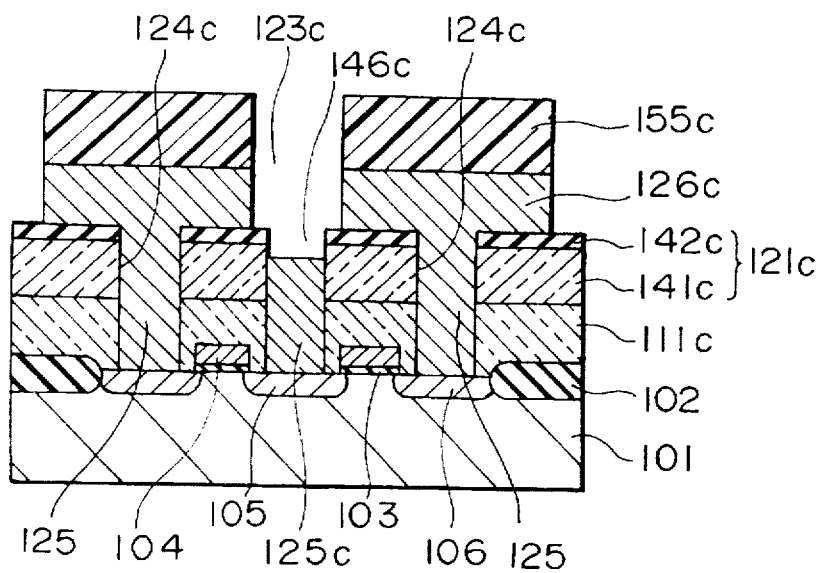
FIGS. 15A to 15C are schematic sectional views, respectively, showing some of manufacturing steps in the third embodiment shown in FIGS. 14A to 14D which are taken along the line XIVB—XIVB in FIG. 14A.
Figure 15B:
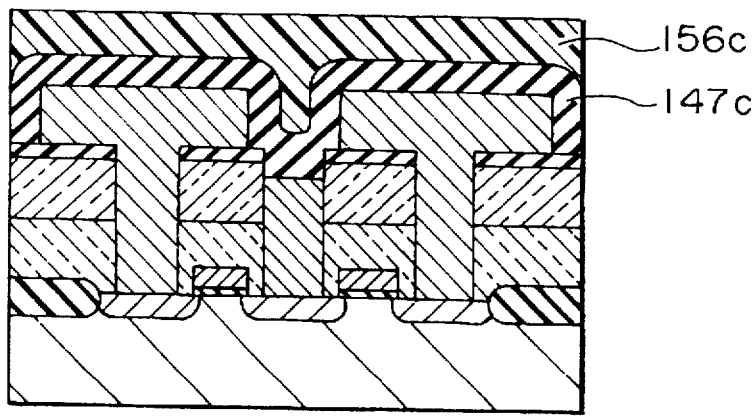
Figure 15C:
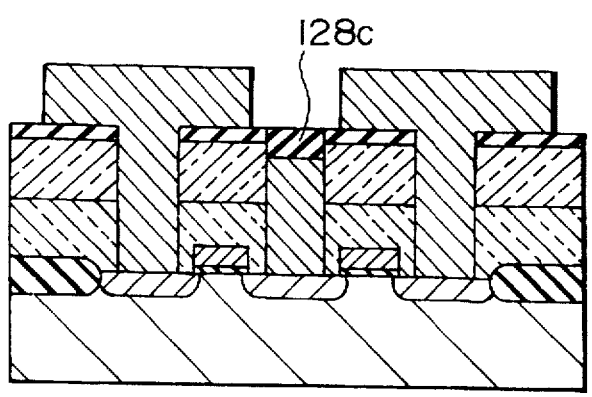

The third embodiment of the present invention will be described along its manufacturing method with reference to FIG. 14A which is a schematic top-cutaway plan view of a DRAM memory cell, FIGS. 14B, 14C, and 14D which are schematic sectional views taken along the lines XIVB—XIVB, XIVC—XIVC, and XIVD—XIVD in FIG. 14A, respectively, and FIGS. 15A to 15C which are schematic sectional views, respectively, showing some of manufacturing steps taken along the line XIVB—XIVB in FIG. 14A. The third embodiment is greatly different from the second embodiment in that no insulating film spacer is formed on the side surface of the storage node electrode from the beginning.

In the same manner as in the second embodiment, the structure up to an interlevel insulating film 111c, bit lines 116, an interlevel insulating film 121c constituted by staking a silicon nitride film 142c on a silicon oxide film 141c, and bit and node contact holes 123c and 124c is formed. An n⁺-type poly-Si film about 300 nm thick is formed on the entire surface by LPCVD. A photoresist film pattern 155c is formed on the surface of this n⁺-type poly-Si film to cover only prospective storage node electrode formation regions. Since no insulating film spacer is formed in the third embodiment, e.g., the interval (projected on the horizontal surface) between the photoresist film pattern 155c and the bit contact hole 123c can be set smaller than the interval between the storage node electrode 126a and the bit contact hole 123a, and equal to, e.g., a predetermined interval between the bit contact hole 123c and the word line 104 or the bit line 116. Similar to the first and second embodiments, anisotropic etching is performed to form storage node electrodes 126c, contact plugs 125c, and plug loss portions 146c (see FIGS. 14A to 14D and 15A).

After the photoresist film pattern 155c is removed, a silicon oxide film 147c is formed on the entire surface by LPCVD. A photoresist film 156c is formed to cover the entire surface (see FIG. 15B).

In the same manner as in, e.g., the modification of the second embodiment, the photoresist film 156c and the silicon oxide film 147c are etched back to leave insulating film caps 128c filled in the plug loss portions 146c (see FIGS. 14A to 14D and 15C).

In the same manner as in the first and second embodiments, a capacitor insulating film 133c and a cell plate electrode 134c are formed on the resultant structure to complete a DRAM according to the third embodiment (see FIGS. 14A to 14D).

The third embodiment has the same effects as those of the second embodiment. Further, in the third embodiment, the interval between the storage node electrodes and the interval between the storage node electrode and the bit contact hole can be set smaller than those in the second embodiment. Accordingly, the capacitor in the third embodiment can have a charge accumulation capacitance larger than that in the second embodiment.

In the third embodiment, the method of forming the insulating film cap filled in the plug loss portion is not limited to the above one. Instead of forming the silicon oxide film 147c by LPCVD, a silicon oxide film having an almost flat upper surface may be formed by liquid-phase epitaxy or bias ECR plasma CVD to cover the upper surfaces of the storage node electrodes. In either case, the insulating film cap can be formed by etching back only the silicon oxide film without forming any photoresist film.

The liquid-phase epitaxy is performed at about 35° C. with a hydrofluorosilicic acid ($H_2SiF_6$) solution in which silicon oxide ($SiO_2$) is dispersed and boric acid ($H_3BO_3$) is added. The bias ECR plasma CVD is performed at microwave power of 2 kW, bias RF power of 1 kW, a monosilane ($SiH_4$) gas flow rate of 20 sccm, an $O_2$ gas flow rate of 100 sccm, and a $CF_4$ gas flow rate of 6 sccm.

Figure 16A:
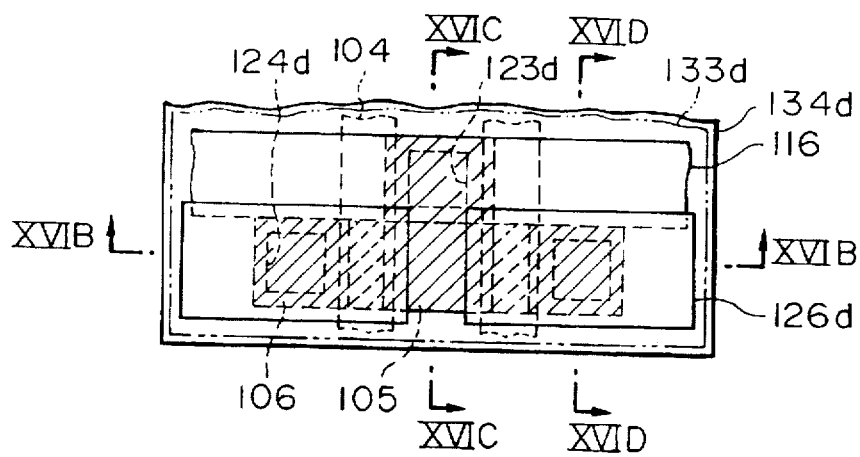
FIG. 16A is a schematic top-cutaway plan view of the fourth embodiment of the present invention.
Figure 16B:
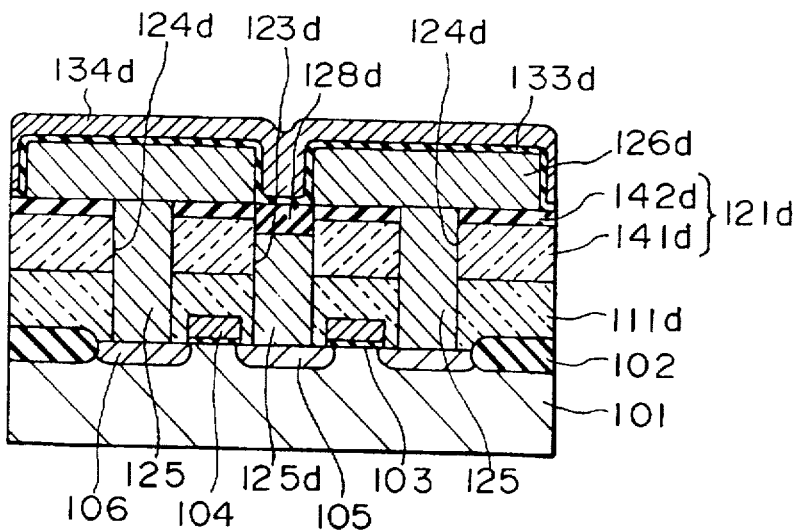
FIGS. 16B to 16D are schematic sectional views taken along the lines XVIB—XVIB, XVIC—XVIC, and XVID—XVID in FIG. 16A, respectively.
Figure 16C:
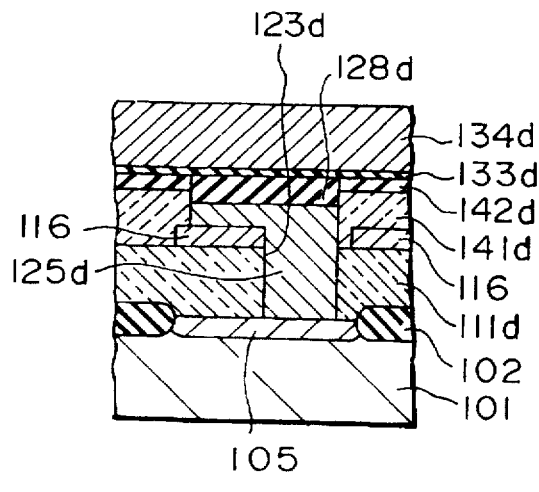
Figure 16D:
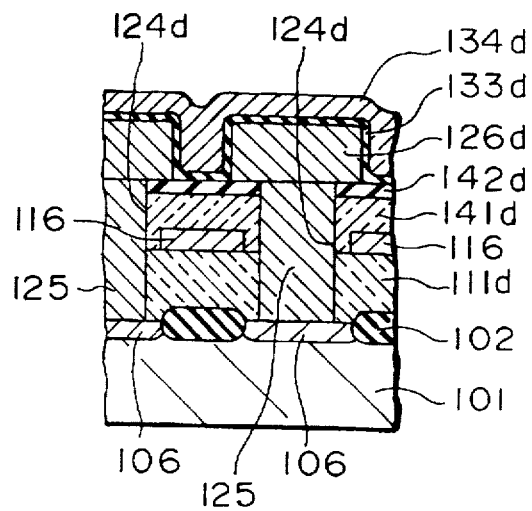
Figure 17A:
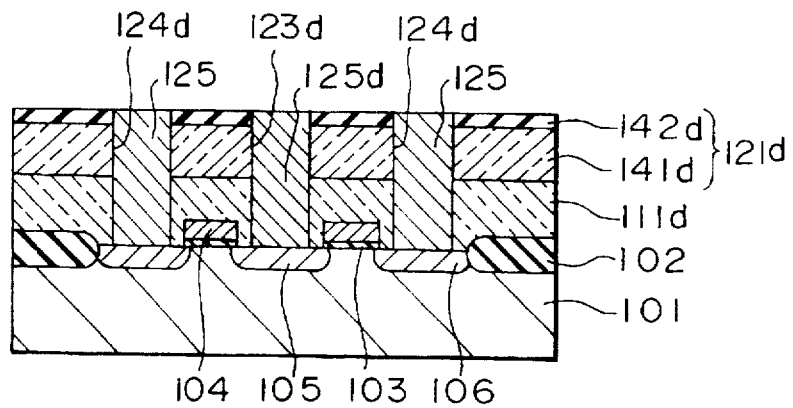
FIGS. 17A to 17D are schematic sectional views, respectively, showing some of manufacturing steps in the fourth embodiment shown in FIGS. 16A to 16D which are taken along the line XVIB—XVIB in FIG. 16A.
Figure 17B:
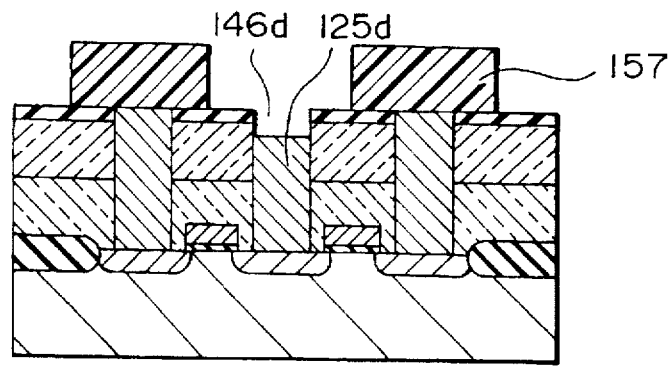
Figure 17C:
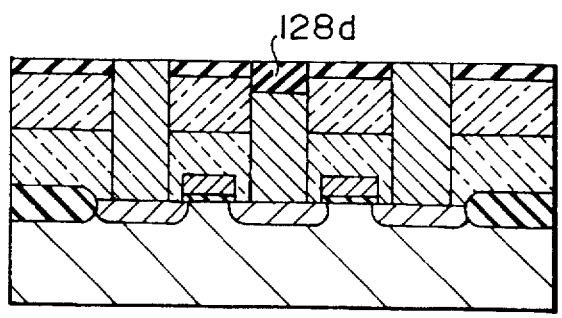
Figure 17D:
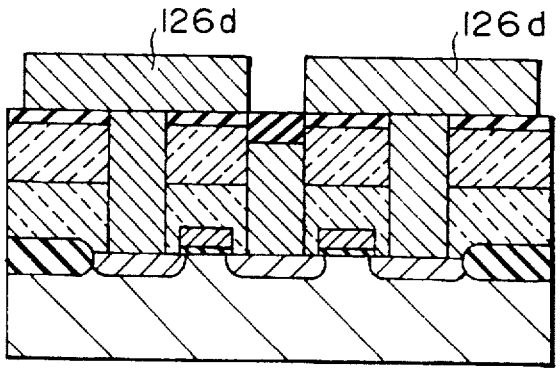

The fourth embodiment of the present invention will be described along its manufacturing method with reference to FIG. 16A which is a schematic top-cutaway plan view of a DRAM memory cell, FIGS. 16B, 16C, and 16D which are schematic sectional views taken along the lines XVIB—XVIB, XVIC—XVIC, and XVID—XVID in FIG. 16A, respectively, and FIGS. 17A to 17D which are schematic sectional views, respectively, showing some of manufacturing steps taken along the line XVIB—XVIB in FIG. 16A. In the fourth embodiment, no insulating film spacer is formed from the beginning, similar to the third embodiment. The fourth embodiment is greatly different from the third embodiment in that a contact plug is also formed in a node contact hole, and a storage node electrode is connected to (the other of) $n^+$-type source/drain regions through this contact plug.

In the same manner as in the third embodiment, the structure up to an interlevel insulating film 111d, bit lines 116, an interlevel insulating film 121d constituted by stacking a silicon nitride film 142d on a silicon oxide film 141d, and bit and node contact holes 123d and 124d is formed.

A conductive film is formed on the entire surface, and etched back to form contact plugs 125 filled in the bit and node contact holes 123d and 124d (see FIGS. 16A to 16D and 17A). This conductive film may be an $n^+$-type poly-Si film in the film formation stage by LPCVD, a titanium nitride film by plasma CVD, or a stacked film constituted by a conductive barrier film with a stacked structure consisting of a titanium film and a titanium nitride film, and a refractory metal silicide film.

A photoresist film pattern 157 is formed on the surface of the interlevel insulating film 121d to cover the upper end portion of the contact plug 125 formed in the node contact hole 124d, while the upper end portion of the contact plug 125 formed in the bit contact hole 123d remains exposed. The photoresist film pattern 157 can be formed by photolithography with low alignment precision, not photolithography with high alignment precision which is required to form the bit and node contact holes 123d and 124d. By anisotropic etching using the photoresist film pattern 157 as a mask, the contact plug 125 formed in the bit contact hole 123d is changed into a contact plug 125d, and a plug loss portion 146d is simultaneously formed (see FIG. 17B).

After the photoresist film 157 is removed, an insulating film cap 128d is formed to fill the plug loss portion 146d in the same manner as in the third embodiment (see FIGS. 16A to 16D and 17C).

An $n^+$-type poly-Si film about 300 nm thick is formed on the entire surface by LPCVD. Photoresist film patterns are formed on the surface of the $n^+$-type poly-Si film to cover only prospective storage node electrode formation regions. Storage node electrodes 126d are formed by anisotropic etching using these photoresist film patterns as a mask (see FIGS. 16A to 16D and 17D). Unlike in the third embodiment, the storage node electrode 126d and the contact plug 125d are separately formed in the fourth embodiment. Therefore, the interval between the storage node electrodes 126d can be equal to the minimum feature size F.

Similar to the first, second, and third embodiments, a capacitor insulating film 133d and a cell plate electrode 134d are formed on the resultant structure to complete a DRAM according to the fourth embodiment (see FIGS. 16A to 16D).

The fourth embodiment has the same effects as those of the third embodiment. Further, in the fourth embodiment, the interval between the storage node electrodes can be set equal to the minimum feature size F. Accordingly, the capacitor in the fourth embodiment can have a charge accumulation capacitance larger than that in the third embodiment.

What I claim is:

1. A method of manufacturing a semiconductor memory device, comprising the steps of:

forming field oxide films in element isolation regions on a surface of a p-type silicon substrate, forming gate oxide films in element formation regions on said surface of said p-type silicon substrate, forming word lines also serving as gate electrodes, and forming $n^+$-type source/drain regions in the element formation regions in self-alignment with said word lines;

forming a first interlevel insulating film consisting of a silicon oxide film;

forming, on a surface of said first interlevel insulating film, bit lines each having a portion overlapping part of one of said $n^+$-type source/drain regions through said first interlevel insulating film;

forming a second interlevel insulating film consisting of a silicon oxide film;

forming bit contact holes through said second and first interlevel insulating films to reach said one of said $n^+$-type source/drain regions, while exposing parts of upper and side surfaces of said bit lines at the overlapping portions, and node contact holes through said second and first interlevel insulating films to reach the other of said $n^+$-type source/drain regions;

forming an $n^+$-type poly-Si film on an entire surface, and a photoresist film pattern on a surface of said $n^+$-type poly-Si film so as to selectively cover prospective storage node electrode formation regions;

performing anisotropic etching for said n$^+$-type poly-Si film by using said photoresist film pattern as a mask to form storage node electrodes directly connected to the other of said n$^+$-type source/drain regions through the node contact holes, and forming, in the bit contact holes, contact plugs each of which has an upper surface located at a level between an upper end of the bit contact hole and an upper surface of said bit line, and is directly connected to said one of said n$^+$-type source/drain regions, and plug loss portions in which no contact plug is filled;

forming an insulating film on an entire surface by low pressure chemical vapor deposition (LPCVD), and etching back said insulating film to form insulating film spacers covering side surfaces of said storage node electrodes, and insulating film caps filled in the plug loss portions; and forming a capacitor insulating film and a cell plate electrode.

2. A method of manufacturing a semiconductor memory device, comprising the steps of:

forming field oxide films in element isolation regions on a surface of a p-type silicon substrate, forming gate oxide films in element formation regions on said surface of said p-type silicon substrate, forming word lines also serving as gate electrodes, and forming n$^+$-type source/drain regions in the element formation regions in self-alignment with said word lines;

forming a first interlevel insulating film consisting of a first silicon-oxide-based insulating film;

forming, on a surface of said first interlevel insulating film, bit lines each having a portion overlapping part of one of said n$^+$-type source/drain regions through said first interlevel insulating film;

forming a second interlevel insulating film constituted by stacking a silicon nitride film on a second silicon-oxide-based insulating film consisting of a same material as that of said first silicon-oxide-based insulating film;

forming bit contact holes through said second and first interlevel insulating films to reach said one of said n$^+$-type source/drain regions, while exposing parts of upper and side surfaces of said bit lines at the overlapping portions, and node contact holes through said second and first interlevel insulating films to reach the other of said n$^+$-type source/drain regions;

forming an n$^+$-type poly-Si film on an entire surface, and a photoresist film pattern on a surface of said n$^+$-type poly-Si film so as to selectively cover prospective storage node electrode formation regions;

performing anisotropic etching for said n$^+$-type poly-Si film by using said photoresist film pattern as a mask to form storage node electrodes directly connected to the other of said n$^+$-type source/drain regions through the node contact holes, and forming, in the bit contact holes, contact plugs each of which has an upper surface located at a level between an upper end of the bit contact hole and an upper surface of said bit line, and is directly connected to said one of said n$^+$-type source/drain regions, and plug loss portions in which no contact plug is filled;

forming an insulating film on an entire surface by LPCVD, and etching back said insulating film to form insulating film spacers covering side surfaces of said storage node electrodes, and insulating film caps filled in the plug loss portions;

selectively removing said insulating film spacers; and forming a capacitor insulating film and a cell plate electrode.

3. A method according to claim 2, further comprising the steps of:

forming a photoresist film to cover an entire surface after forming said insulating film spacers and said insulating film caps, and selectively etching back said photoresist film until part of each of said insulating film spacers is exposed; and selectively removing said insulating film spacers by using said remaining photoresist film as a mask, and removing said photoresist film.

4. A method according to claim 2, further comprising the step of forming a photoresist film to cover an entire surface after forming said insulating film spacers and said insulating film caps, and simultaneously etching back said photoresist film and said insulating film spacers.

5. A method of manufacturing a semiconductor memory device, comprising the steps of:

forming field oxide films in element isolation regions on a surface of a p-type silicon substrate, forming gate oxide films in element formation regions on said surface of said p-type silicon substrate, forming word lines also serving as gate electrodes, and forming n$^+$-type source/drain regions in the element formation regions in self-alignment with said word lines;

forming a first interlevel insulating film consisting of a first silicon-oxide-based insulating film;

forming, on a surface of said first interlevel insulating film, bit lines each having a portion overlapping part of one of said n$^+$-type source/drain regions through said first interlevel insulating film;

forming a second interlevel insulating film constituted by stacking a silicon nitride film on a second silicon-oxide-based insulating film consisting of a same material as that of said first silicon-oxide-based insulating film;

forming bit contact holes through said second and first interlevel insulating films to reach said one of said n$^+$-type source/drain regions, while exposing parts of upper and side surfaces of said bit lines at the overlapping portions, and node contact holes through said second and first interlevel insulating films to reach the other of said n$^+$-type source/drain regions;

forming an n$^+$-type poly-Si film on an entire surface, and a photoresist film pattern on a surface of said n$^+$-type poly-Si film so as to selectively cover prospective storage node electrode formation regions;

performing anisotropic etching for said n$^+$-type poly-Si film by using said photoresist film pattern as a mask to form storage node electrodes directly connected to the other of said n$^+$-type source/drain regions through the node contact holes, and forming, in the bit contact holes, contact plugs each of which has an upper surface located at a level between an upper end of the bit contact hole and an upper surface of said bit line, and is directly connected to said one of said n$^+$-type source/drain regions, and plug loss portions in which no contact plug is filled;

forming a silicon oxide film on an entire surface to leave insulating film caps consisting of said silicon oxide film at the plug loss portions; and forming a capacitor insulating film and a cell plate electrode.

6. A method according to claim 5, wherein said silicon oxide film is formed by LPCVD, and said insulating film caps are left by forming a photoresist film to cover said silicon oxide film and etching back said photoresist film and said silicon oxide film.

7. A method according to claim 5, wherein said silicon oxide film is formed by liquid-phase epitaxy, and said insulating film caps are left by etching back said silicon oxide film.

8. A method according to claim 5, wherein said silicon oxide film is formed by bias ECR plasma CVD, and said insulating film caps are left by etching back said silicon oxide film.

9. A method of manufacturing a semiconductor memory device, comprising the steps of:

forming field oxide films in element isolation regions on a surface of a p-type silicon substrate, forming gate oxide films in element formation regions on said surface of said p-type silicon substrate, forming word lines also serving as gate electrodes, and forming $n^+$-type source/drain regions in the element formation regions in self-alignment with said word lines;

forming a first interlevel insulating film consisting of a first silicon-oxide-based insulating film;

forming, on a surface of said first interlevel insulating film, bit lines each having a portion overlapping part of one of said $n^+$-type source/drain regions through said first interlevel insulating film;

forming a second interlevel insulating film constituted by stacking a silicon nitride film on a second silicon-oxide-based insulating film consisting of a same material as that of said first silicon-oxide-based insulating film;

forming bit contact holes through said second and first interlevel insulating films to reach said one of said $n^+$-type source/drain regions, while exposing parts of upper and side surfaces of said bit lines at the overlapping portions, and node contact holes through said second and first interlevel insulating films to reach the other of said $n^+$-type source/drain regions;

forming a conductive film on an entire surface, etching back said conductive film to fill the node contact holes to upper ends, thereby forming first contact plugs directly connected to the other of said $n^+$-type source/drain regions, and to fill the bit contact holes to upper ends, thereby forming second contact plugs directly connected to said one of said $n^+$-type source/drain regions;

selectively etching said second contact plugs by using, a photoresist film pattern as a mask which covers surfaces of said first contact plugs and has opening portions on surfaces of said second contact plugs, thereby forming third contact plugs each having an upper surface located at a level between an upper end of the bit contact hole and an upper surface of said bit line, and plug loss portions in which no third contact plug is filled;

forming a silicon oxide film on an entire surface to leave insulating film caps consisting of said silicon oxide film at the plug loss portions;

forming an $n^+$-type poly-Si film on an entire surface, and patterning said $n^+$-type poly-Si film to form storage node electrodes directly connected to said first contact plugs; and forming a capacitor insulating film and a cell plate electrode.

* * * * *